(12) United States Patent
Choi

(10) Patent No.: US 8,318,510 B2
(45) Date of Patent: Nov. 27, 2012

(54) METHOD AND APPARATUS FOR MANUFACTURING MAGNETORESISTIVE ELEMENT

(75) Inventor: Young-suk Choi, Santa Clara, CA (US)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 54 days.

(21) Appl. No.: 12/872,374

(22) Filed: Aug. 31, 2010

(65) Prior Publication Data
US 2011/0086439 A1  Apr. 14, 2011

Related U.S. Application Data

(63) Continuation of application No. PCT/JP2009/054327, filed on Mar. 6, 2009.

(30) Foreign Application Priority Data

Mar. 7, 2008  (JP) .................................. 2008-058404

(51) Int. Cl.
H01L 43/12 (2006.01)
(52) U.S. Cl. ..................................... 438/3; 257/E43.006
(58) Field of Classification Search .................. 118/600, 118/696, 697; 257/295, E43.006; 438/3
See application file for complete search history.

(56) References Cited

U.S. PATENT DOCUMENTS

| 6,451,215 | B1 | 9/2002 | Shimazawa et al. | |
| 7,193,890 | B2 * | 3/2007 | Nagase et al. | 365/158 |
| 2006/0007605 | A1 | 1/2006 | Li et al. | |
| 2006/0056115 | A1 | 3/2006 | Djayaprawira et al. | |
| 2007/0109147 | A1 | 5/2007 | Fukuzawa et al. | |
| 2007/0111332 | A1 | 5/2007 | Zhao et al. | |
| 2008/0005891 | A1 | 1/2008 | Yuasa et al. | |
| 2008/0024120 | A1 | 1/2008 | Sasaki et al. | |
| 2008/0055793 | A1 | 3/2008 | Djayaprawira et al. | |
| 2008/0124454 | A1 | 5/2008 | Djayaprawira et al. | |
| 2008/0180862 | A1 | 7/2008 | Djayaprawira et al. | |
| 2009/0061105 | A1 * | 3/2009 | Fukuzawa et al. | 427/539 |

FOREIGN PATENT DOCUMENTS

| CN | 1746980 | | 3/2006 |
| JP | 2001-034919 | A | 2/2001 |
| JP | 2006-024349 | A | 1/2006 |
| JP | 2006-058748 | A | 3/2006 |

(Continued)

OTHER PUBLICATIONS

J.S. Moodera et al., "Large Magnetoresistance at Room Temperature in Ferromagnetic Thin Film Tunnel Junctions," Physical Review Letters, Apr. 17, 1995, pp. 3273-3276, vol. 74, No. 16, The American Physical Society.

(Continued)

Primary Examiner — Julio J Maldonado
Assistant Examiner — Daniel Shook
(74) Attorney, Agent, or Firm — Buchanan Ingersoll & Rooney PC

(57) ABSTRACT

A method of manufacturing a magnetoresistive element includes a tunnel barrier forming step. The tunnel barrier forming step comprises a metal layer forming step of forming a metal layer to have a first thickness, a plasma processing step of performing a plasma treatment which exposes the metal layer to a plasma of an inert gas to etch the metal layer to have a second thickness smaller than the first thickness, and an oxidation step of oxidizing the metal layer having undergone the plasma treatment to form a metal oxide which forms a tunnel barrier.

9 Claims, 11 Drawing Sheets

FOREIGN PATENT DOCUMENTS

| JP | 2006-134950 | 5/2006 |
|---|---|---|
| JP | 2007-124340 A | 5/2007 |
| JP | 2008-016739 A | 1/2008 |
| KR | 10-2004-0096010 | 11/2004 |
| KR | 10-2006-0051048 | 5/2006 |
| WO | WO 2008/012959 A1 | 1/2008 |

OTHER PUBLICATIONS

W.H. Butler et al., "Spin-dependent tunneling conductance of Fe/MgO/Fe sandwiches," Physical Review B, 2001, pp. 054416-1-054416-12, vol. 63, The American Physical Society.

Shinji Yuasa et al., "Giant room-temperature magnetoresistance in single-crystal Fe/MgO/Fe magnetic tunnel junctions," Nature Materials, Dec. 2004, pp. 868-871, vol. 3, Nature Publishing Group.

Stuart S.P. Parkin et al., "Giant tunnelling magnetoresistance at room temperature with MgO (100) tunnel barriers," Nature Materials, Dec. 2004, pp. 862-867, vol. 3, Nature Publishing Group.

David D. Djayaprawira et al., "230% room-temperature magnetoresistance in CoFeB/MgO/CoFeB magnetic tunnel junctions," Applied Physics Letters, 2005, pp. 1-3, vol. 86, 092502, American Institute of Physics.

Byongguk Park et al., "A study on tunneling magnetoresistance in magnetic tunnel junctions oxidized by ozone," Journal of Magnetism and Magnetic Materials, 2001, pp. 926-929, vol. 226-230, Elsevier Science B.V.

S.C. Oh et al., "Magnetic and Electrical Properties of Magnetic Tunnel Junctions With Radical Oxidized MgO Barriers," IEEE Transactions on Magnetics, Oct. 2006, pp. 2642-2644, vol. 42, No. 10, IEEE.

Satoru Yoshimura et al., "Oxidation process of Mg films by using high-concentration ozone for magnetic tunnel junctions," Journal of Magnetism and Magnetic Materials, 2007, pp. 176-180, vol. 312, Elsevier B.V.

Saied Tehrani et al., "Magnetoresistive Random Access Memory Using Magnetic Tunnel Junctions," Proceedings of the IEEE, May 2003, pp. 703-714, vol. 19, No. 5, IEEE.

N. F. Mott, "A Theory of the Formation of Protective Oxide Films on Metals," Trans. Faraday Soc., 1939, pp. 1175-1177, vol. 35.

N. Cabrera, "On the Oxidation of Metals at Low Temperatures and the Influence of Light," Phil. Magaz., 1949, p. 175-189, vol. 40.

D. Starodub et al., "The reaction of $O_2$ with Al(110): a medium energy ion scattering study of nano-scale oxidation," Surface Science, 2004, pp. 199-214, vol. 552, Elsevier B.V.

David M. Wood, "Classical Size Dependence of the Work Function of Small Metallic Spheres," Physical Review Letters, Mar. 16, 1981, p. 749, vol. 46, No. 11.

Jun Soo Bae et al., "Study of the effect of natural oxidation and thermal annealing on microstructures of $AlO_x$ in the magnetic tunnel junction by high-resolution transmission electron microscopy," Applied Physics Letters, Feb. 18, 2001, pp. 1168-1170, vol. 80, No. 7, American Institute of Physics.

Office Action dated Oct. 30, 2009, issued in the corresponding Japanese Patent Application No. 2009-530719.

Office Action (Notice of Preliminary Rejection) dated Mar. 18, 2011, issued in the corresponding Korean Patent Application No. 10-2009-7024158, and an English Translation thereof.

International Search Report (PCT/ISA/210) issued on Jun. 2, 2009, for International Application No. PCT/JP2009/054327.

Written Opinion (PCT/ISA/237) issued on Jun. 9, 2009, for International Application No. PCT/JP2009/054327.

Chinese Official Action issued in Chinese Patent Application No. 200980107745.5, dated Aug. 1, 2012, and English Translation thereof.

\* cited by examiner

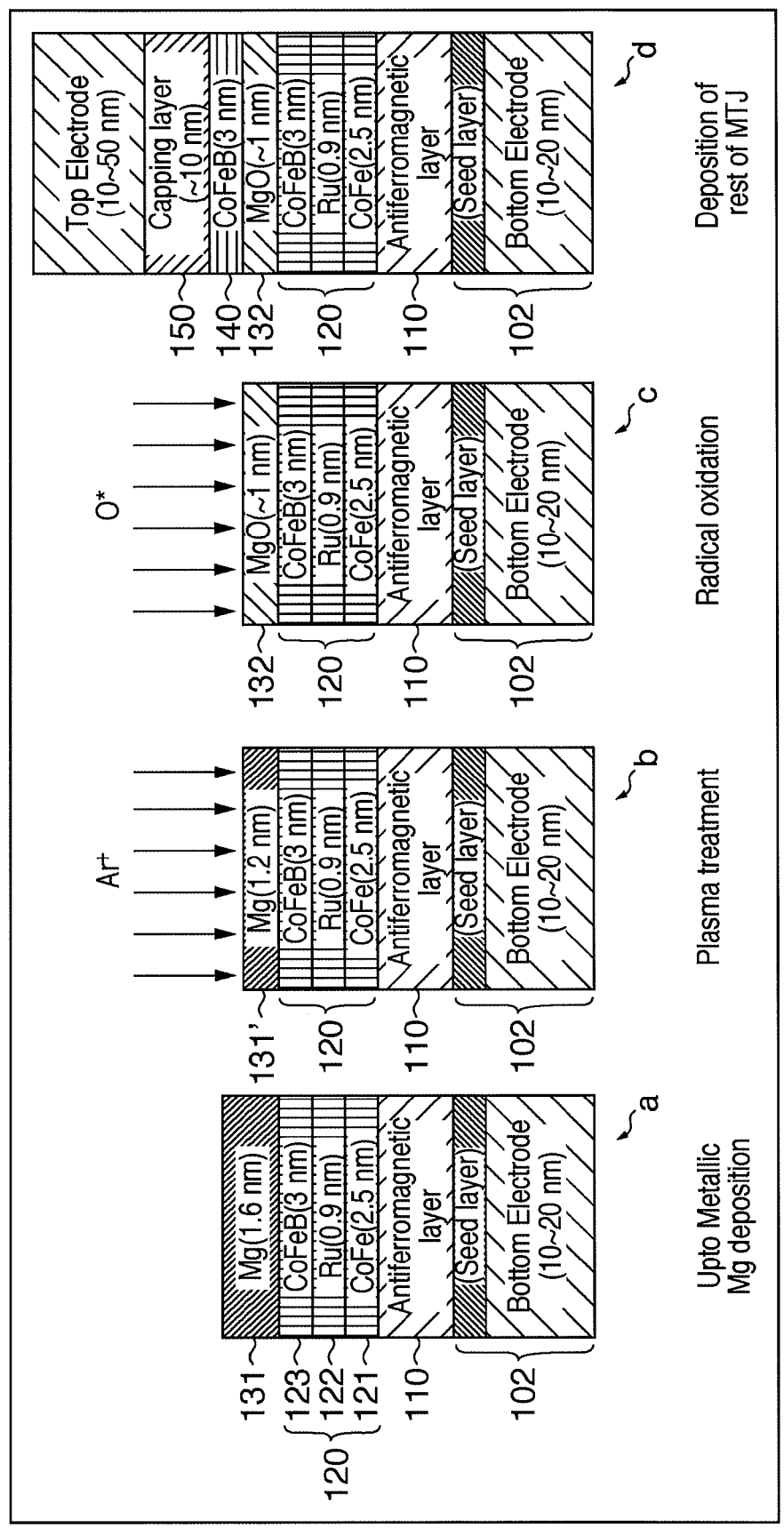

METHOD AND APPARATUS FOR MANUFACTURING MAGNETORESISTIVE ELEMENT

TECHNICAL FIELD

The present invention relates to a method and apparatus for manufacturing a magnetoresistive element and, more particularly, to a magnetic tunnel junction (MTJ) device and a technique for manufacturing an MTJ device applicable to, for example, a magnetic read head and a magnetic random access memory (MRAM).

BACKGROUND ART

A magnetic tunnel junction (MTJ) device is in essence a variable resistor including two ferromagnetic layers, and a tunnel barrier sandwiched between them. The relative orientation of magnetization of the two ferromagnetic layers generates a difference in tunneling probability of electrons spin-polarized upon passing through the tunnel barrier, and this results in a change in resistance.

A tunnel barrier is generally made of a dielectric material, and must be very thin and have an extremely uniform thickness and composition. Nonuniformity in chemical composition or thickness of the tunnel barrier significantly degrades the device performance.

Ever since the invention of MTJ devices, the development of MTJ devices with a high TMR ratio at room temperature has become a hot industrial topic in order to realize spintronic applications such as a nonvolatile magnetic random access memory and a read head for a hard disk with an a real density higher than 100 Gbit/in$^2$ (Moodera et al., Phys. Rev. Lett., 74 (1995), p 3273).

In the beginning, a high TMR ratio was achieved by a ferromagnetic electrode layer with high spin polarization and an amorphous $AlO_x$ tunnel barrier. The highest TMR ratio at room temperature, which was achieved with this configuration, is about 70%. After that, a spin filtering effect obtained by a single-crystal MgO tunnel barrier with the NaCl structure was proposed by theoretical calculation (Butler et al., Phys. Rev., B 63, (2001), p 054416). With this proposal, a TMR ratio as high as 6,000% at room temperature was predicted to be achieved.

This prediction is based on the fact that the crystal structure of single-crystal MgO has fourfold rotational symmetry, so an electronic state which exhibits a tunneling probability high enough to transmit MgO is only Δ1 with fourfold symmetry. Hence, conduction in a Δ1 band is predominant in an MTJ with a single-crystal Fe/MgO/Fe structure, but the Δ1 band in Fe is spin-polarized 100% at the Fermi level, so a sufficient tunneling probability cannot be obtained when an MTJ has antiparallel magnetization alignment. In other words, MgO has the effect of filtering spins in accordance with the magnetization alignment state.

This allows coherent tunneling, and, in turn, attains a giant TMR ratio. In order to achieve this giant TMR ratio, an experiment in which single-crystal Fe/MgO/CoFe is grown by molecular beam epitaxy was conducted, and the experimental result showed a TMR ratio of 180% at room temperature (Yuasa et al., Appl. Phys. Lett., 87 (2005), p 222508).

An MTJ device made of a combination of polycrystalline CoFe ferromagnetic electrodes and an MgO tunneling barrier has been reported to have a TMR ratio of 220% at room temperature (Parkin et al., Nat. Mater., 3 (2004), p 862). Moreover, an MTJ formed by depositing a combination of amorphous CoFeB and an MgO tunnel barrier on a silicon substrate, having thermally oxidized silicon deposited on it, by a magnetron sputtering method that is a practical deposition method has been reported to have a higher TMR ratio (Djayaprawira et al., Appl. Phys. Lett., 86 (2005), p 092502).

A great deal of effort has been put into forming an MTJ tunnel barrier which is very thin and has an extremely uniform thickness and composition. To form an oxide tunnel barrier, an important point is how to avoid oxidation of the surface of a ferromagnetic electrode layer under the tunnel barrier layer, and nonuniformity of the oxygen profile in the oxide tunnel barrier.

In general, methods of depositing tunnel barriers are classified into a method of directly depositing an oxide, and a method of depositing a metal and thereafter performing an oxidation process of the metal. RF-sputtering which uses an oxide target, or reactive sputtering in which a metal target is sputtered in an oxygen atmosphere exemplifies the method of direct deposition. In the method of depositing a metal and thereafter performing an oxidation process of the metal, natural oxidation, plasma oxidation, radical oxidation, or ozone oxidation exemplifies the oxidation process.

SUMMARY OF INVENTION

Technical Problem

It is difficult to fabricate an MTJ device with a sufficiently high TMR ratio at room temperature, and an R×A product (normalized resistance), which falls within a tolerance for a spintronic application. This is because the manufacture of a spin transfer torque MRAM application requires an R×A product less than 50 $\Omega\mu m^2$ and a TMR ratio higher than 150%, and the manufacture of a read head for a hard disk with an a real density of about 250 Gbit/in$^2$ requires an R×A product equal to or less than 2 $\Omega\mu m^2$ and a TMR ratio higher than 30% at room temperature.

One of critical bottlenecks for the MTJ development is difficulty in controlling the thickness of a tunnel barrier to a very small, uniform thickness. If the tunnel barrier is too thin, a leakage current which does not contribute to spin-dependent tunneling is more likely to be generated due to, for example, electrical pinholes. This degrades the signal-to-noise ratio (S/N) significantly.

Another bottleneck is a deviation from the chemical stoichiometry of the tunnel barrier material due to, for example, over- or under-oxidation or oxidation of the underlying ferromagnetic electrode layer. These factors bring about the same effect as when the thickness of the tunnel barrier increases upon spin scattering by the underlying ferromagnetic layer having its surface oxidized, and this leads to asymmetric characteristics as functions of the applied voltage, an abnormal increase in R×A product, and an abnormal decrease in TMR ratio (Park et al., J. Magn. Magn. Mat., 226-230 (2001), p 926). FIG. 2 shows the various oxidation states upon forming tunnel barriers. Referring to FIG. 2, reference symbol "RL" denotes a ferromagnetic reference layer which is formed under the tunnel barrier; and "FL", a ferromagnetic free layer which is formed on the tunnel barrier.

It has recently been confirmed that direct deposition of a tunnel barrier from a sintered ceramic target by RF-sputtering, as in an MTJ containing MgO, makes it possible to obtain an R×A product required for all spintronic applications, and a very high TMR ratio free from any pinhole structure (Japanese Patent Application No. 2006-058748). However, RF-sputtering has a problem which is hard to resolve for mass production and in which the MR ratio and R×A product are very likely to change due to factors associated with the chamber state, and particle generation (Oh et al., IEEE Trans. Magn., 42 (2006), p 2642). Furthermore, an MTJ device having an MgO tunnel barrier formed by RF-sputtering has been reported to have a final R×A product uniformity (1σ) of 10% or more. In contrast to this, an MTJ device having an MgO tunnel barrier formed by depositing Mg and thereafter performing an oxidation process of Mg has an R×A product uniformity (1σ) of less than 3% (U.S. Pre-Grant Publication No. 2007/0111332).

Also, a method of depositing a metal and thereafter performing plasma oxidation of the metal is widely used to fabricate an MTJ device having an $AlO_x$ tunnel barrier. However, the reactivity of the deposited metal in plasma oxidation is so high that it is difficult to oxidize only the ultra-thin metal layer. Especially the oxidation rate of Mg in forming MgO is very fast to the degree that the interface of the underlying ferromagnetic layer will surely be oxidized. Oxidation of the underlying ferromagnetic layer results in a significant increase in R×A product compared to ozone oxidation although the TMR ratio remains nearly the same as the latter oxidation. The R×A product and TMR ratio when a plasma oxidation process is performed on an MTJ having an $AlO_x$ tunnel barrier are 10,000 Ωμm² and 45%, respectively (Tehrani et al., IEEE Trans. Magn., 91 (2003), p 703). On the other hand, the R×A product and TMR ratio when an ozone oxidation process is performed on the MTJ are 1,000 Ωμm² and 30%, respectively (Park et al., J. Magn. Magn. Mat., 226-230 (2001), p 926).

To combat this situation, oxidation processes which require lower energies, such as radical oxidation and ozone oxidation, have been proposed as methods of forming MgO tunnel barriers. However, the R×A product and TMR ratio obtained by radical oxidation of 8-Å Mg are 230 Ωμm² and 90%, respectively, and those obtained by ozone oxidation of 13-Å Mg are 1,000 Ωμm² and 10%, respectively. Spin transfer torque MRAM applications must have an R×A product less than 50 Ωμm² and a TMR ratio higher than 150%, so these methods generate too low TMR ratios and too high R×A products to be applied to these products. This implies that radical and ozone oxidation processes of Mg cannot be less energetic and slow enough to control the oxidation of Mg to form MgO tunnel barriers. An oxidation process which requires an energy lower than the above-mentioned oxidation processes can be achieved by natural oxidation. However, the resistance of the junction is extremely low, and it is surmised that nonuniform oxidation induces a nonuniform current in the junction area (Park et al., J. Magn. Magn. Mat., 226-230 (2001), p 926).

Solution to Problem

The inventor of the present invention thought up this invention from, for example, the following findings.

Formation of a monolayer of an oxide on the metal interface separates two reactants (a metal and oxygen), and the separation becomes larger as the oxidation proceeds. This implies that one or both of the reactants must be transported to continue the oxidation process.

In accordance with the theory of metal oxidation, Mott and Carbrera proposed that the tendency for the ion mobility at room temperature to lower is strengthened by the electric field established in the oxide (Mott, Trans. Faraday Soc., 35 (1939) p 1175 and Cabrera, Phil. Magaz., 40 (1949), p 175).

In this model, as shown in FIG. 3(a), electrons tunnel through a thin oxide layer initially formed on the metal surface, and ionize the oxygen atoms chemisorbed on the oxide surface. This forms a uniform electric field across the oxide, and this results in a shift in Fermi energy level, as shown in FIG. 3(b).

Mott and Carbrera assumed that metal ions are mobile species within the oxide, and pass through the oxide by hopping across defective portions at the metal/oxide interface or the oxide/metal interface.

[Mathematical 1]

$$v\exp\left(\frac{-W}{k_B T}\right) \qquad (1)$$

$$v\exp\left(\frac{-(W-qaE)}{k_B T}\right) \qquad (2)$$

The hopping probability of the metal ions when no electric field is established is given by expression (1), where v is the vibration frequency, W is the activation energy required to hop from the metal to the oxide, $k_B$ is a Boltzman constant, and T is the temperature. The hopping probability of the metal ions when an electric field is established across the oxide is given by expression (2), where q is the electron charge, and a is the hopping distance, as shown in FIG. 4.

The hopping probability of the ions is significantly enhanced upon driving the electric field established across the oxide, and this accounts for the fact that the first oxidation of the metal takes place at room temperature. The Mott and Carbrera model assumes that the mobile species is metal ions induced from the metal/oxide interface. However, recently, oxygen profiling in the depth direction in the oxide revealed that oxygen ions are transported by migration of oxide lattice defects (Starodub et al., Surf. Scie., (2004), p 199).

Furthermore, Mott and Carbrera model assumes a homogeneous, planar layer of a metal and an oxide. However, in practice a thin metal film deposited by physical vapor deposition (PVD) is formed from crystal grains on the scale of nanometers, which have a surface morphology related to the crystal grain structure.

[Mathematical 2]

$$\Phi(eV) = \Phi_\infty + \Delta\Phi \qquad (3)$$

This crystal grain structure modifies the work function of the metal surface as expression (3), where $\Phi_\infty$ is the work function of a homogeneous metal, and $\Delta\Phi$ is a change in work function by the morphology related to the crystal grain structure.

[Mathematical 3]

$$\Delta\Phi = \frac{3}{8}\frac{e^2}{\varepsilon_0 \varepsilon_r R} \qquad (4)$$

where R is the radius of the crystal grains, $\varepsilon_0$ is the vacuum permittivity, and $\varepsilon_r$ is the relative permittivity (Wood, Phys. Rev. Lett., 46 (1981), p 749).

The work function controls the driving electric field across the oxide, and thus the oxidation rate can also be significantly exponentially modified. As the crystal grain size of the metal layer gets smaller and thus the surface becomes smoother, the work function increases correspondingly, and the electric field equilibrium and the potential difference across the oxide decrease correspondingly and, consequently, the oxidation rate decreases significantly.

Therefore, in order to overcome the aforementioned obstacles to achieving uniform thickness control of a tunnel barrier of an MTJ, and uniformity of the chemical stoichiometric composition of the tunnel barrier, it is necessary to modify the microstructure of the metal layer to oxidize it while keeping the oxidation rate low.

As described above, in the present invention, a metal layer which forms a tunnel barrier is bombarded with ions prior to an oxidation process to modify the surface microstructure of the metal to be oxidized, so the grain size is reduced and the metal surface is further planarized. This makes it possible to reduce the driving electric field established across the oxide to keep the oxidation rate low accordingly, thereby uniforming the oxygen profile.

Advantageous Effects of Invention

According to the present invention, it is possible to obtain an MTJ device with a high TMR ratio and a low R×A product.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 5A shows schematic views of deposition sequences of an MTJ having an MgO tunnel barrier fabricated by a method according to the present invention;

DESCRIPTION OF EMBODIMENTS

Embodiments of the present invention will be described in detail below. The constituent elements described in these embodiments are merely examples. The technical scope of the present invention is determined by the appended claims and is not limited to the following individual embodiments.

First Embodiment

Figure 1:
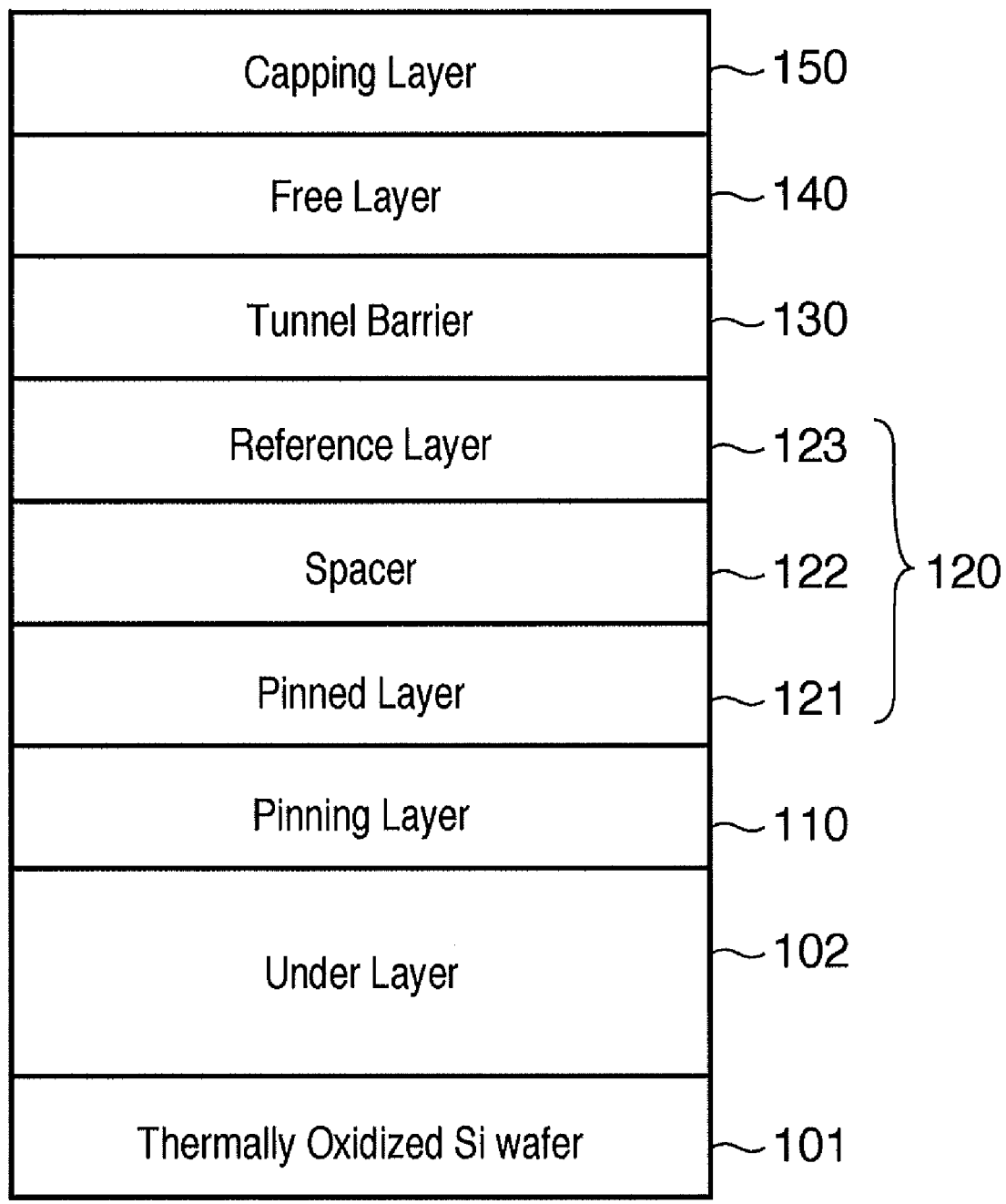
FIG. 1 is a schematic view of a magnetic tunnel junction.
Figure 2:
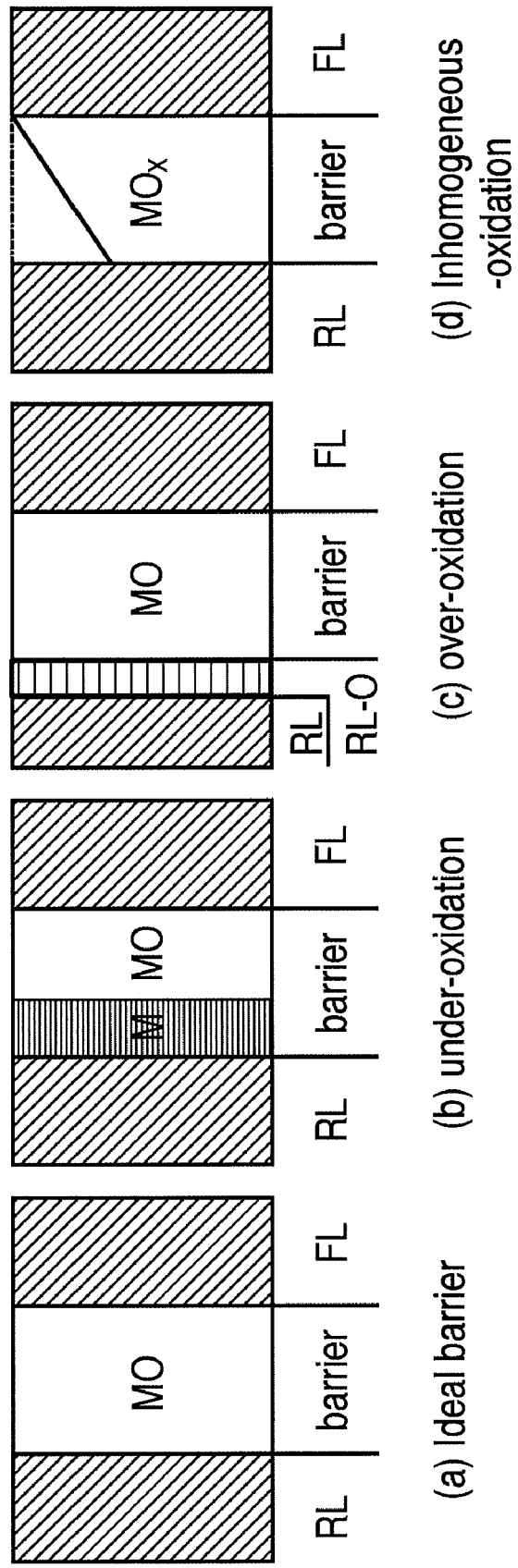
FIG. 2 shows schematic views of various oxidation states of a tunnel barrier after oxidation which follows metal deposition, in which (a) shows an ideal barrier, (b) shows under-oxidation, (c) shows over-oxidation, and (d) shows inhomogeneous oxidation.
Figure 3:
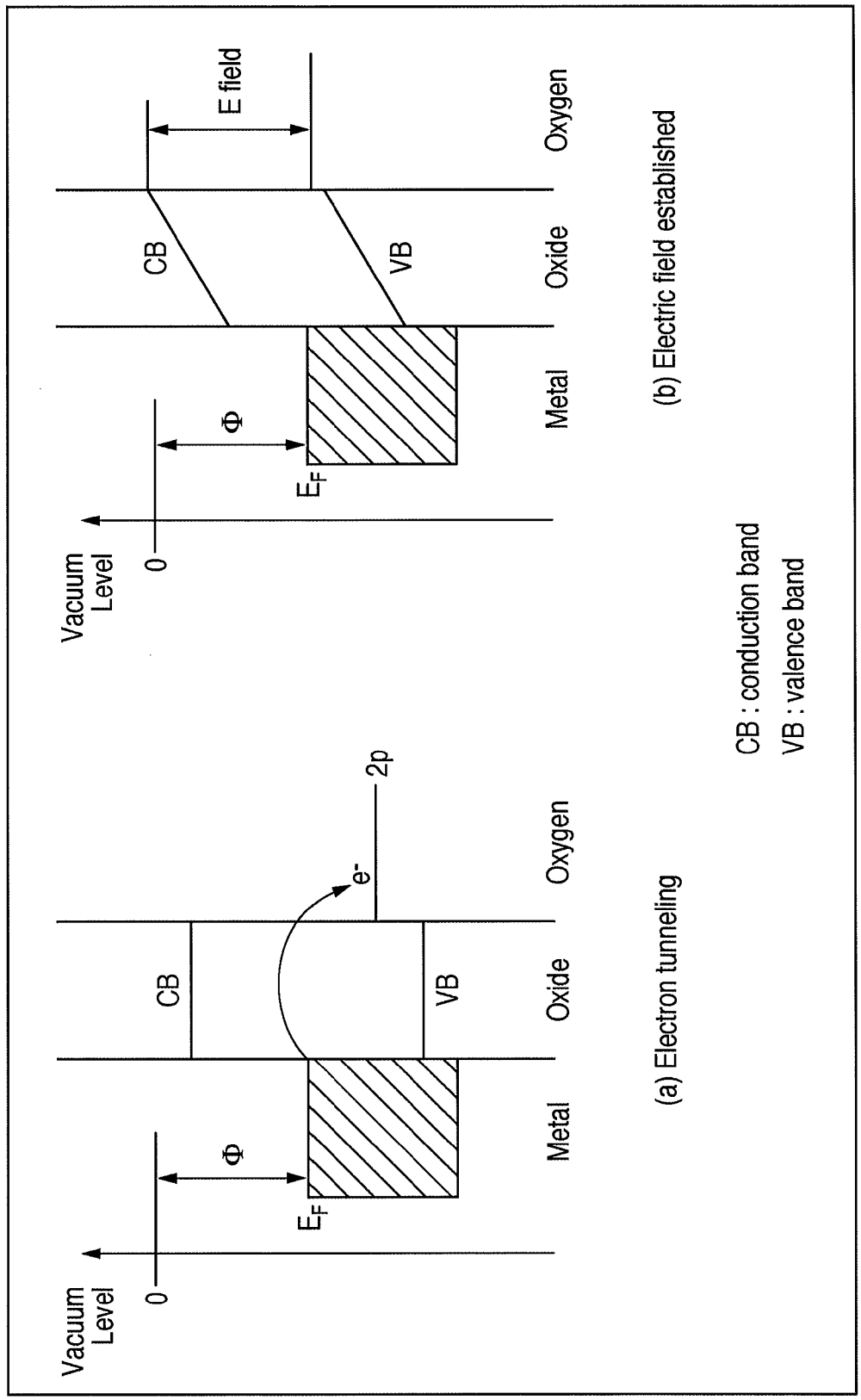
FIG. 3 shows schematic views of electric fields established across an oxide layer, in which (a) shows the initial state; the state in which the O 2p level is lower than $E_F$ of a metal, and (b) shows energy levels in equilibrium in an electric field established across the oxide layer due to the tunneling of electrons from the metal to the oxygen.
Figure 4:
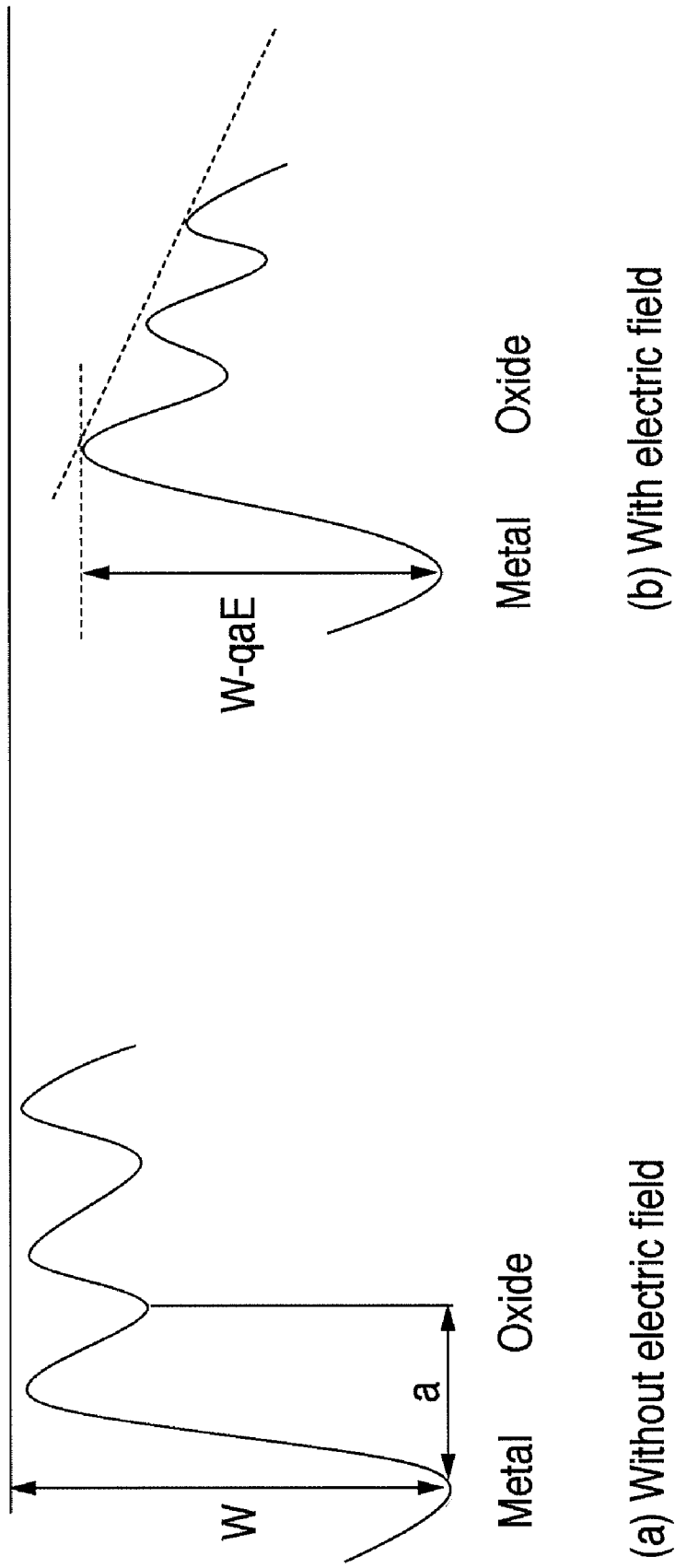
FIG. 4 shows schematic graphs of activation energies required for the metal ions to make the first hop, in which (a) shows the state in which no electric field is established across the oxide, and (b) shows the state in which an electric field is established across the oxide.

FIG. 1 shows the typical stack structure of a tunneling magnetoresistance (TMR) sensor or memory cell. Most MTJs each include a ferromagnetic pinning layer 110, synthetic antiferromagnetic pinned layer 120, tunnel barrier 130, and ferromagnetic free layer 140. The stack structure shown in FIG. 1 is formed to include a ferromagnetic pinned layer 121, non-magnetic spacer 122, and ferromagnetic reference layer 123.

First, the surface of a substrate 101 is etched by a plasma treatment in order to clean up any impurities. An under layer 102 (for example, Ta/CuN/Ta/CuN/Ru) is deposited on the surface of the substrate 101 having undergone the plasma treatment, and an antiferromagnetic pinning layer 110 (for example, IrMn) is deposited on the under layer 102. After that, a ferromagnetic pinned layer 121 (for example, $Co_{70}Fe_{30}$) is deposited on the antiferromagnetic pinning layer 110. A metallic spacer 122 (for example, Ru) is deposited on the ferromagnetic pinned layer 121, and a ferromagnetic reference layer 123 (for example, CoFeB) is deposited on the metallic spacer 122. Metallic Mg is deposited on the ferromagnetic reference layer 123 to have a thickness larger than the final target thickness of Mg. A plasma treatment using Ar ions is performed on the metallic Mg to remove any excessive Mg to form an Mg layer with the target thickness.

Radical oxidation is performed on the Mg layer having undergone the plasma treatment to form a tunnel barrier 130 containing MgO. A CoFeB ferromagnetic free layer 140 is deposited on the tunnel barrier 130, and a capping layer 150 containing Ta/Cu/Ta/Ru is deposited on the CoFeB ferromagnetic free layer 140. The substrate is transferred to an anneal furnace and annealed.

Figure 9:
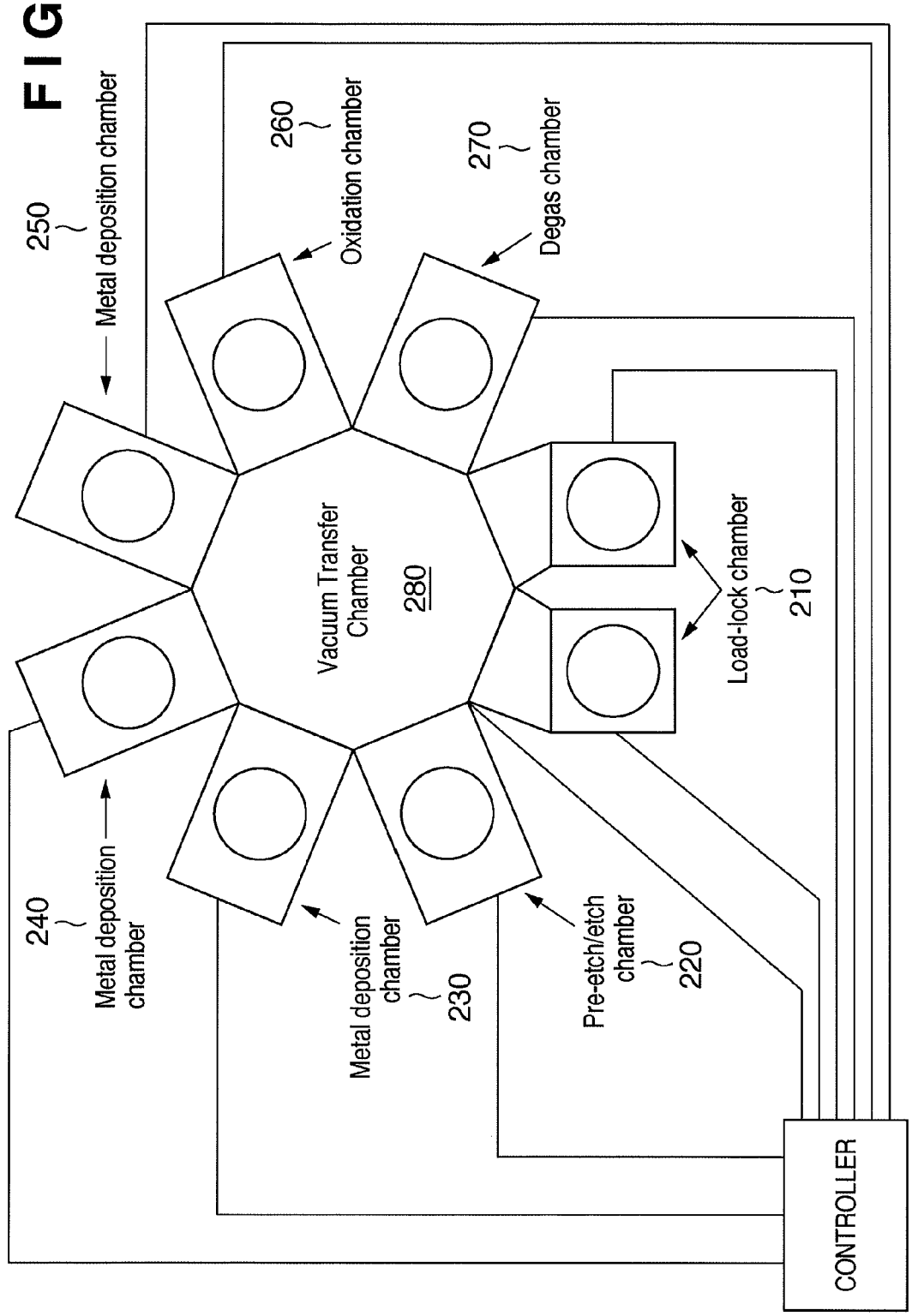
FIG. 9 is a view exemplifying an MTJ manufacturing apparatus.

FIG. 9 exemplifies an MTJ device manufacturing apparatus in the first embodiment, and is a schematic plan view showing a vacuum processing system for processing a magnetic tunnel junction device.

The vacuum processing system shown in FIG. 9 is of a cluster type system including a plurality of deposition chambers 230, 240, and 250 which can deposit thin films using physical vapor deposition. The plurality of deposition chambers 230, 240, and 250 are connected to a vacuum transfer chamber 280 including robot loaders (not shown) at their center. Also, two load-lock chambers 210 to load/unload substrates are connected to the vacuum transfer chamber 280, and can feed substrates to the robot feeders or recover substrates transferred by the robot feeders.

The vacuum processing system also includes a degas chamber 270 and pre-etch/etch chamber 220. The vacuum processing system moreover includes an oxidation chamber 260. The chambers in the vacuum processing system are connected to each other via gate valves to open/close the passages between them.

Each chamber in the vacuum processing system also includes a pumping system, gas introduction system, and power supply system. Moreover, the gas introduction system includes a flow control device such as a mass flow controller, and the pumping system includes a conductance regulating means such as a valve which is disposed between the pump and the chamber and regulates the conductance. Although not shown, each chamber also includes a manometer to measure the pressure in the chamber. The chamber can be controlled at a predetermined pressure for a predetermined time by operating the flow control device and conductance regulating means based on the result output from the manometer.

In each of the deposition chambers 230, 240, and 250 in the vacuum processing system, magnetic layers and non-magnetic layers are deposited on the substrate one by one by a sputtering method. A target containing CoFe, a target containing Ru, a target containing CoFeB, and a target containing Mg, for example, are disposed in each of these deposition chambers. Also, targets serving as an antiferromagnetic material, seed material, capping material are disposed in at least one of these deposition chambers.

Moreover, targets serving as a top electrode material and bottom electrode material are disposed in at least one of the deposition chambers. Pre-etching and a plasma treatment are performed in the pre-etch/etch chamber 220. An oxidation process is performed in the oxidation chamber 260.

A more detailed example of the method of forming an MTJ will be described next.

FIG. 5A shows an example of deposition sequences of an MTJ having an MgO tunnel barrier. These deposition sequences are performed by executing a program by a controller which controls constituent elements of the vacuum processing system.

FIG. 5A-$a$ shows the state in which a metallic Mg layer 131 (thickness: 1.6 nm) is deposited on a synthetic antiferromagnetic pinned layer 120. In this embodiment, the metallic Mg layer 131 is formed by DC-sputtering. Particle generation is an issue to be examined for mass production of MRAMs. This phenomenon is likely to occur when an MgO tunnel barrier is formed by RF-sputtering using an MgO ceramic target. As is obvious from FIG. 6, RF-sputtering and DC-sputtering generate different numbers of particles. When the numbers of mechanical particles generated in the process of transferring substrates between the deposition chambers are compared between DC-sputtering using a metallic Mg target and RF-sputtering using an MgO ceramic target, the number of particles with sizes larger than 0.16 µm is greater by one digit in the RF-sputtering than in the DC-sputtering. The numbers of particles are measured for a 200-mm substrate by a KLA Tencor SP1 system. Hence, a process of depositing a metallic Mg layer by DC-sputtering is a particle-free process.

Figure 7:
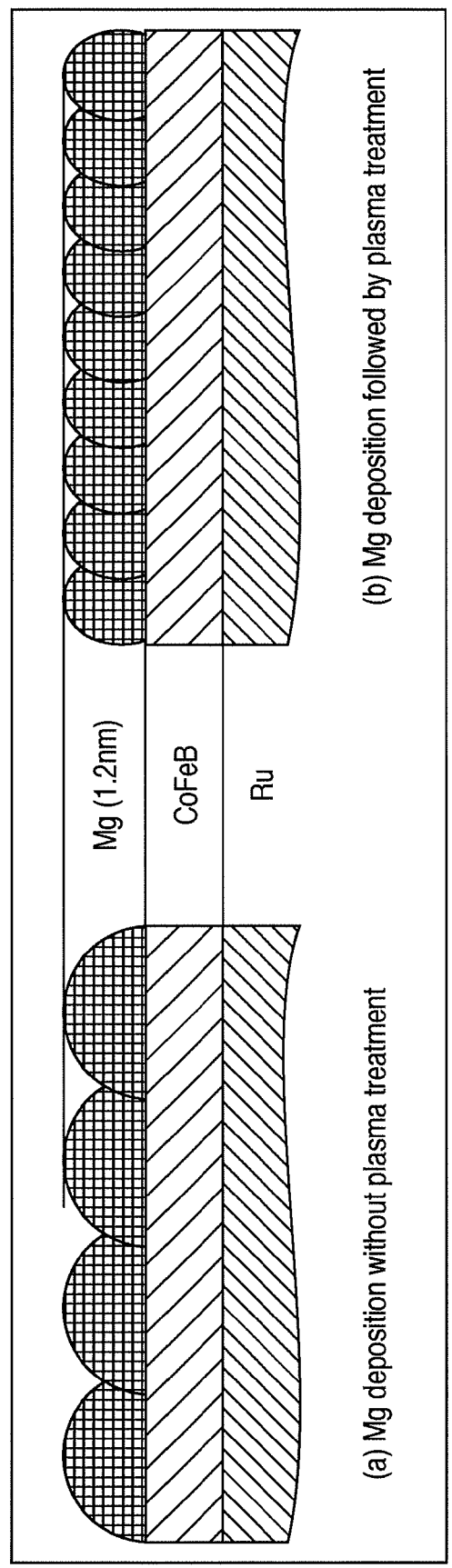
FIG. 7 is a view exemplifying a comparison between the grain size when an Mg layer has undergone a plasma treatment and that when the Mg layer has undergone no plasma treatment.

Referring to FIG. 5A-$b$, a plasma treatment is performed. In the first embodiment, a capacitively-coupled plasma is generated by supplying power to the electrode on the substrate holder side, of the electrode on the substrate holder side and the counterelectrode opposed to it. A plasma of Ar gas is generated at an Ar gas flow rate of 30 sccm by supplying an RF power of 30 W as plasma generation power. Under this plasma treatment condition, a plasma treatment is performed for 20 sec to etch the 1.6-nm metallic Mg layer 131 by 0.4 nm at an Mg etch rate of 0.02 nm/sec into a 1.2-nm metallic Mg layer 131'. This plasma treatment not only etches the surface of the Mg layer but also modifies the surface microstructure of the remaining Mg layer. Taking account of the atomic mass of Ar ions (atomic mass of Ar: 39.95 g/mol) colliding against the Mg layer (atomic mass of Mg: 24.31 g/mol), most of the collision energy is transferred to the target Mg layer. Therefore, the surface morphology and the microstructure are modified significantly, so the grain size is reduced and the surface is planarized. In other words, as shown in FIG. 7, the Mg layer (FIG. 7($b$)) which has a thickness of 1.2 nm and has undergone a plasma treatment has a smaller grain size and a flatter surface than the Mg layer (FIG. 7($a$)) which has the same thickness as the former and has not been treated.

In the first embodiment, radical oxidation shown in FIG. 5A-$c$ is performed in the oxidation chamber 260 including a shower plate electrically grounded between the upper ionizing electrode and the substrate. An oxygen plasma is generated by, for example, supplying an RF power of 800 W to the upper ionizing electrode at an oxygen flow rate of 600 sccm. Because the shower plate is electrically grounded, charged particles such as ions and electrons cannot pass through it, but oxygen radicals pass through it and impinge on the substrate. The radical oxidation is performed on the 1.2-nm Mg layer 131' for 90 sec to form an MgO tunnel barrier 132.

Referring to FIG. 5A-$d$, a CoFeB ferromagnetic free layer 140, capping layer 150, and top electrode layer are deposited on the MgO tunnel barrier 132. After deposition of each layer is completed, magnetic field annealing is performed at 180° C. and a magnetic field strength of 3 kOe for 2 hrs, and then performed at 360° C. and a magnetic field strength of 3 kOe for 2 hrs. In this manner, in two-step annealing, crystallization of the MgO tunnel barrier 130 is accelerated by annealing at a relatively low temperature first. Then, the CoFeB ferromagnetic free layer 140 crystallizes using the crystal of the MgO tunnel barrier 130 as a mold by annealing at a higher temperature. Thus, a satisfactory crystal structure which achieves a high TMR ratio is formed.

An effect check test according to the present invention will be described next.

For the sake of comparison, MTJs having MgO tunnel barriers in this embodiment and in a conventional example in which no plasma treatment is performed were fabricated. The magnetotransport properties of the MTJs having the MgO tunnel barriers were measured using the CIPT (Current-In-Plane Tunneling) method.

Figure 8:
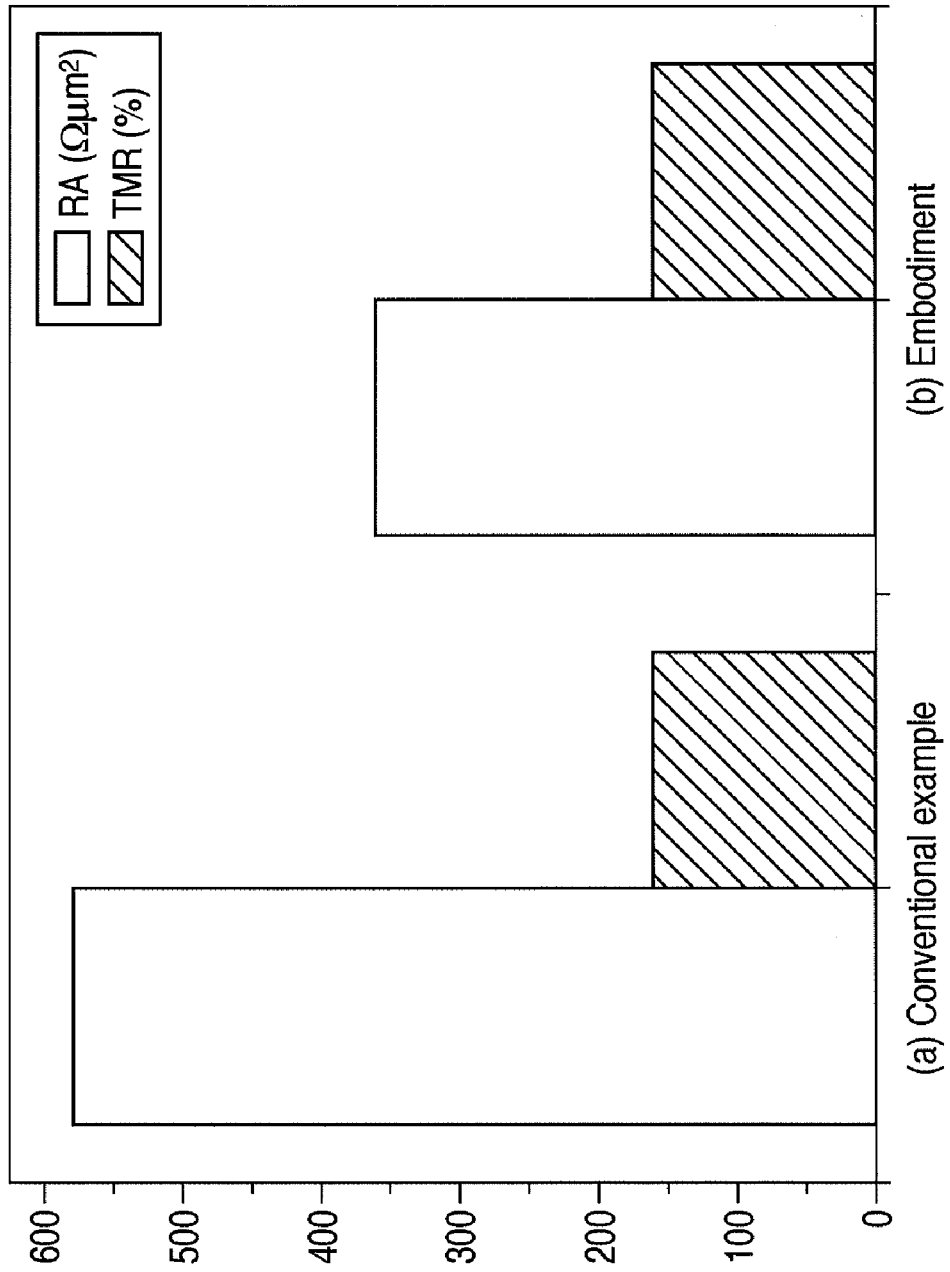
FIG. 8 is a graph showing the result of an effect check test.

FIG. 8 shows the result. The MTJ in this embodiment, which contained MgO and was formed by the method according to the first embodiment, had its R×A product greatly decreased to 350 Ωµm$^2$, so a TMR ratio as high as 160% was achieved, as shown in FIG. 8($b$). In contrast, the MTJ in the conventional example had an R×A product of 580 Ωµm$^2$ and a TMR ratio of 160%, as shown in FIG. 8($a$).

Figure 10:
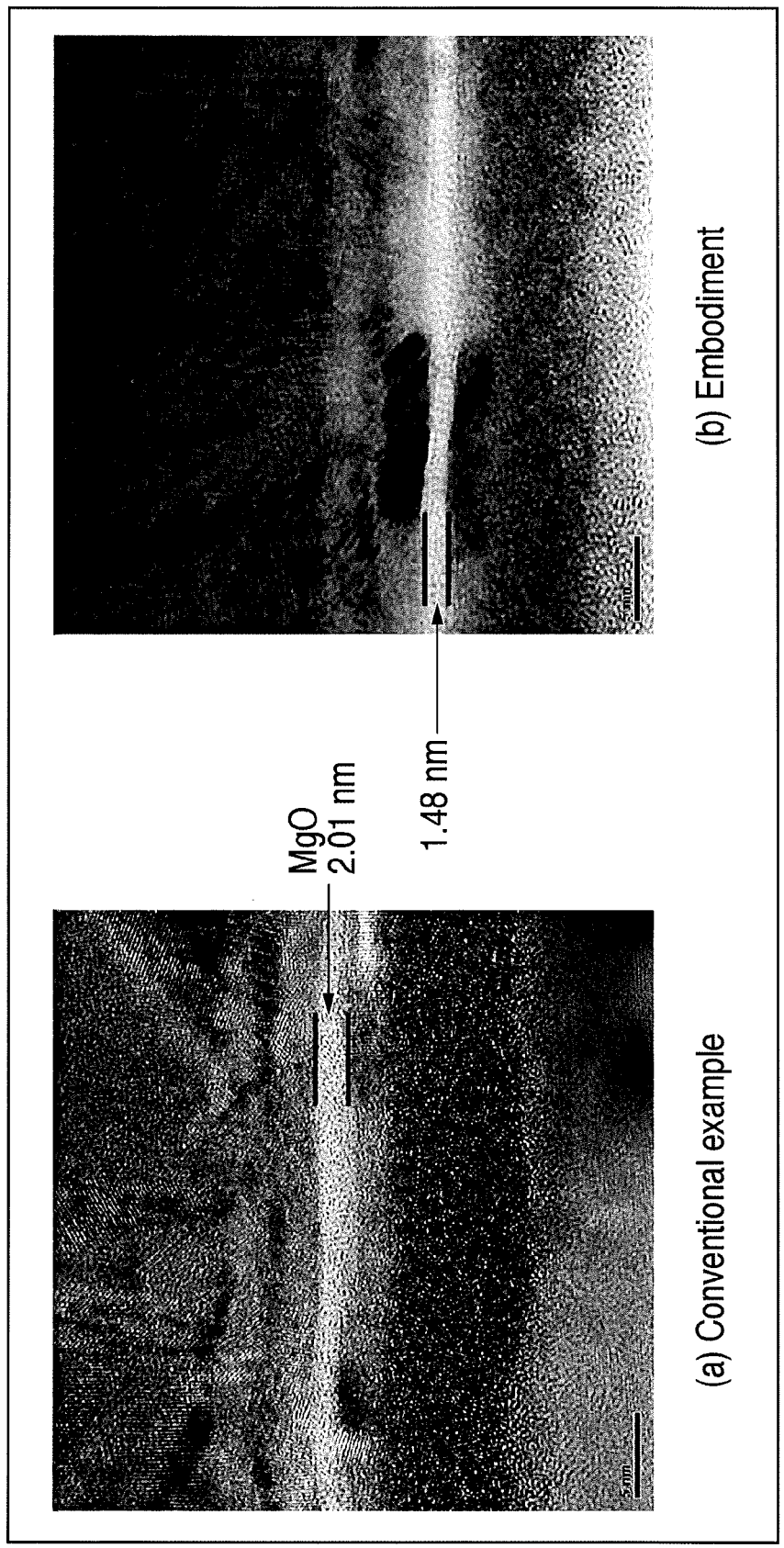
FIG. 10 shows views of a comparison of the thicknesses of MgO tunnel barriers, in which (a) shows a case in which the Mg layer has undergone a plasma treatment, and (b) shows a case in which the Mg layer has undergone no plasma treatment. The photographs were obtained by a high-resolution electron microscope.

Also, structural analysis of the MTJs in the embodiment and conventional example was performed using an HRTEM (High-Resolution Transmission Electron Microscopy). As a result, as shown in FIG. 10, the MTJ having the MgO tunnel barrier in the embodiment had a thickness of 1.48 nm, whereas that having the MgO tunnel barrier in the conventional example had a thickness of 2.01 nm. Note that the Mg thickness and radical oxidation condition before radical oxidation are the same between the embodiment and the conventional example. The inventor of the present invention examined this result and concluded that a difference in thickness of MgO generates a large difference in R×A product.

An MTJ with an R×A product less than 50 Ωµm$^2$ and a TMR ratio higher than 160% is expected to be realized by further adjustment for the first embodiment. The MTJ fabricated by the method shown in the first embodiment is suitable for a high-density/high-performance spin transfer torque MRAM application.

Second Embodiment

Figure 5B:
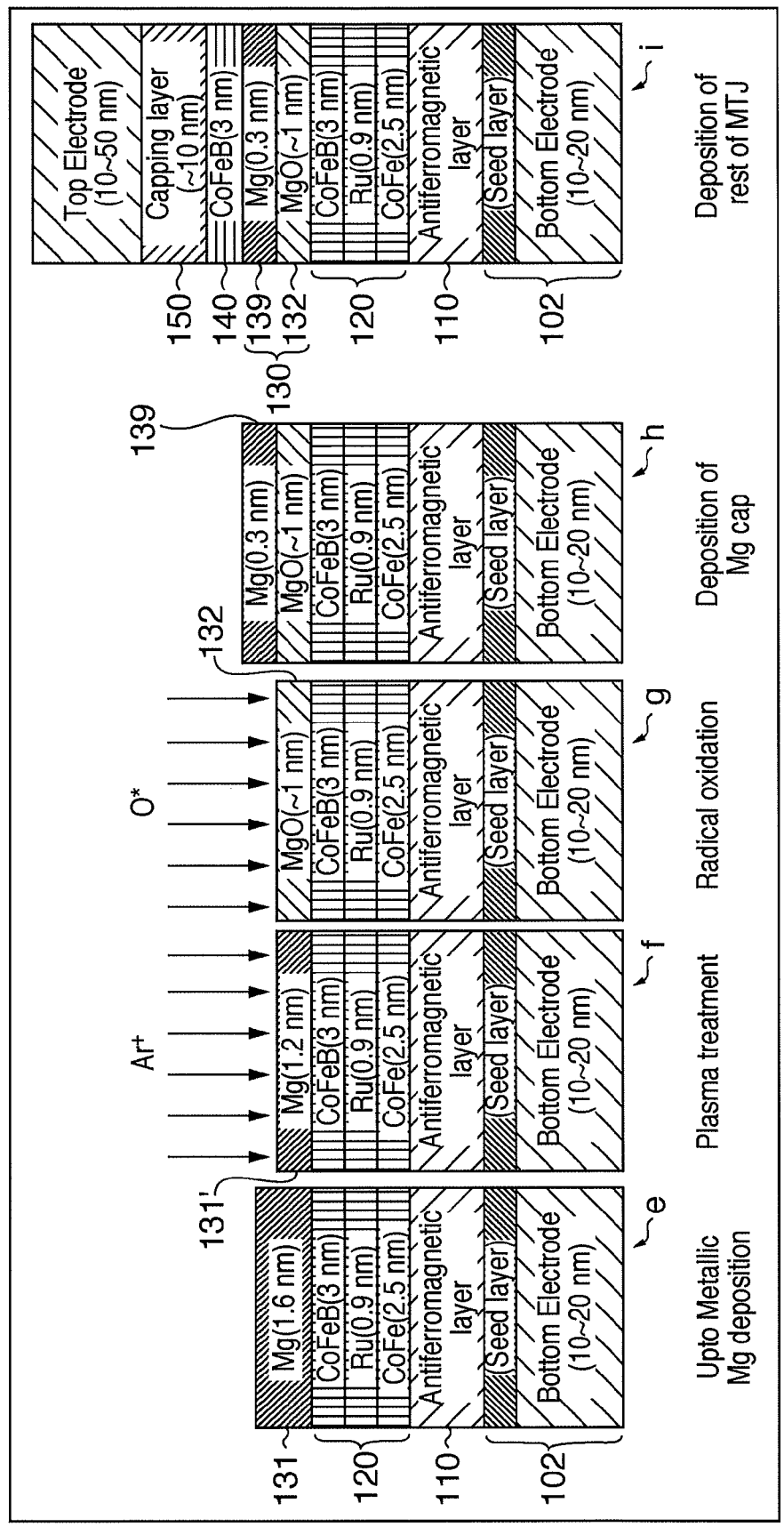
FIG. 5B shows schematic views of deposition sequences of an MTJ having an MgO tunnel barrier fabricated by another method according to the present invention.
Figure 6:
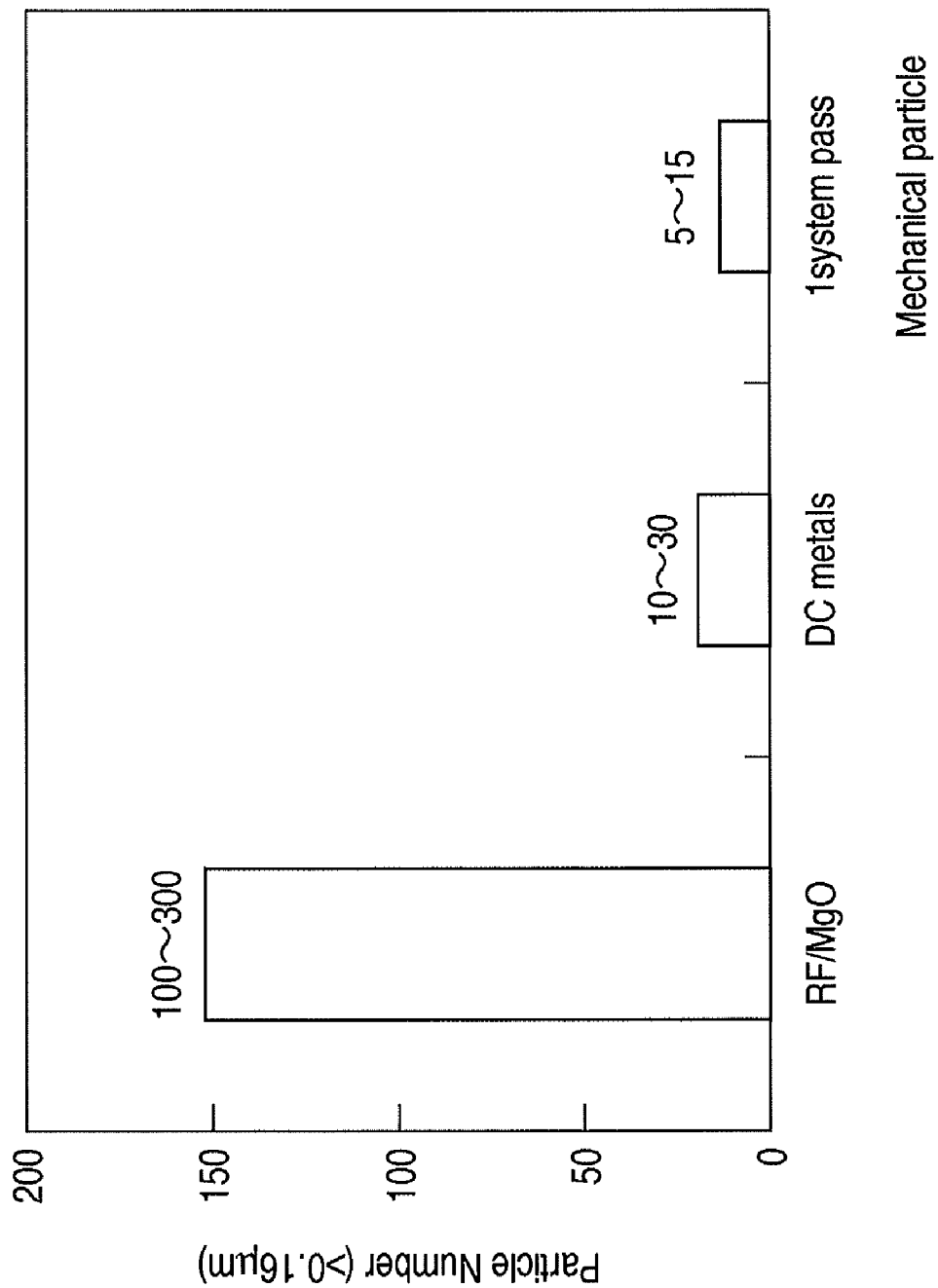
FIG. 6 shows a comparison of the numbers of particles generated by different sputtering processes.

FIG. 5B shows deposition sequences of MgO according to the second embodiment.

In the second embodiment, a metallic Mg layer 131 is deposited on a CoFeB ferromagnetic reference layer 123 to have a thickness of 1.6 nm. The metallic Mg layer 131 is etched by 0.4 nm and has its microstructure modified at once by a plasma treatment to form an MgO tunnel barrier 132. After that, an Mg cap layer 139 is deposited on the MgO tunnel barrier 132 by 0.3 nm.

As described above, metallic Mg deposition is preferably done by DC-sputtering, which can suppress particle generation. Also, in the plasma treatment, a plasma of Ar gas is generated at an Ar gas flow rate of 30 sccm by, for example, supplying an RF power of 30 W as plasma generation power. Under this plasma treatment condition, a plasma treatment is performed for 20 sec to etch the 1.6-nm metallic Mg layer 131 by 0.4 nm at an Mg etch rate of 0.02 nm/sec into a 1.2-nm metallic Mg layer 131'. In the radical oxidation, an oxygen plasma is generated by, for example, supplying an RF power of 800 W to the upper ionizing electrode at an oxygen flow rate of 600 sccm, again as in the first embodiment. The radical oxidation is performed on the 1.2-nm Mg layer 131' for, for example, 90 sec to form an MgO tunnel barrier 132.

As shown in FIG. 5B-i, a CoFeB ferromagnetic free layer 140, capping layer 150, and top electrode layer are deposited on the MgO tunnel barrier 132. After deposition of each layer is completed, magnetic field annealing is performed at 180° C. and a magnetic field strength of 3 kOe for 2 hrs, and then performed at 360° C. and a magnetic field strength of 3 kOe for 2 hrs. In this manner, in two-step annealing, crystallization of the MgO tunnel barrier 130 is accelerated by annealing at a relatively low temperature first. Then, the CoFeB ferromagnetic free layer 140 crystallizes using the crystal of the MgO tunnel barrier 130 as a mold by annealing at a higher temperature. Thus, a satisfactory crystal structure which achieves a high TMR ratio is formed.

As described above, by forming the Mg cap layer 139 on the MgO tunnel barrier 132, the interface of the CoFeB ferromagnetic free layer 140 can be prevented from oxidizing, thus achieving a high TMR ratio.

An MTJ with an R×A product less than 50 $\Omega\mu m^2$ and a TMR ratio higher than 160% is expected to be realized by further adjustment for the first embodiment. The MTJ fabricated by the method shown in the first embodiment is suitable for a high-density/high-performance spin transfer torque MRAM application.

Although embodiments of the present invention have been described above, the application of the present invention is not limited to the above-mentioned embodiments.

For example, the stack structure of a device having an MTJ is not limited to that shown in FIG. 1.

Also, the oxidation process is not limited to radical oxidation, and plasma oxidation, ozone oxidation, and natural oxidation, for example, can also be adopted.

Moreover, the metal layer to form a tunnel barrier can contain at least one of Mg, Al, Cr, Ni, Ta, Ti, Hf, Si, Zr, and Ga. Similarly, the cap layer is not limited to Mg, and can contain at least one of, for example, Al, Cr, Ni, Ta, Ti, Hf, Si, Zr, and Ga.

The ferromagnetic layers such as the ferromagnetic free layer and ferromagnetic reference layer are not limited to those formed from CoFeB, and can be made of, for example, CoFe, Fe, NiFe, or a material containing one of them as a major component and an additive. Also, a material containing Co, Fe, and B at a composition ratio (for example, 60:20:20) other than 1:1:1 can be used. Moreover, a material containing different elements can be used.

Also, the ferromagnetic layer is not limited to a monolayer, and may include two or more ferromagnetic layers with different coercive forces, or a non-magnetic spacer may be sandwiched between ferromagnetic layers with different coercive forces.

In an exemplary structure of such ferromagnetic layers, the interface with the tunnel barrier is a layer containing CoFeB, and a layer containing NiFe is formed on the opposite side of the tunnel barrier on the layer containing CoFeB.

In an exemplary structure in which the non-magnetic spacer is sandwiched between ferromagnetic layers, the interface with the tunnel barrier is a layer containing CoFeB, and an Ru layer and NiFe layer are formed in turn at the interface of the CoFeB layer on the opposite side.

Although the ferromagnetic reference layer is formed on the substrate side with respect to the ferromagnetic free layer, the ferromagnetic free layer may be formed on the substrate side conversely.

A layer which is amorphous at the interface with the tunnel barrier crystallizes in the aforementioned magnetic field annealing using the tunnel barrier as a crystallization mold. This achieves a high TMR ratio.

The ferromagnetic layer may be formed not only by DC-sputtering but also by RF-sputtering. The ferromagnetic layer may also be formed by epitaxial growth, instead of sputtering. The use of a sputtering method allows low-cost, rapid manufacture of an MTJ device.

The plasma treatment is not limited to the use of argon gas, and can use an inert gas such as A, Kr, or Xe with an atomic mass heavier than Mg. A mixture of two or more types of inert gases may also be used. The plasma used to perform the plasma treatment may be, for example, an inductively-coupled plasma. The thickness (first thickness) of the metallic Mg layer 131 before the plasma treatment preferably is 10 Å (inclusive) to 20 Å (inclusive). The thickness (second thickness) of the metallic Mg layer 131 after the plasma treatment preferably is 6 Å (inclusive) to 14 Å (inclusive). Note that the ratio of the second thickness to the first thickness preferably is, for example, 3/10 (inclusive) to 5/7 (inclusive). Too high a thickness ratio hampers exhibition of the effect of the present invention, whereas too low a thickness ratio, that is, too large an amount of etching degrades the properties of an MTJ.

Although preferred embodiments of the present invention have been described above with reference to the accompanying drawings, the present invention is not limited to these embodiments, and can be changed into various forms within the technical scope understood from a description of the scope of claims.

This application claims priority based on Japanese Patent Application No. 2008-58404, filed Mar. 7, 2008, which is hereby incorporated by reference herein in its entirety.

The invention claimed is:

1. A method of manufacturing a magnetoresistive element, a tunnel barrier forming step of the method comprising:
    a metal layer forming step of forming a metal layer to have a first thickness;
    a plasma processing step of performing a plasma treatment which exposes the metal layer to a plasma of an inert gas to etch the metal layer to have a second thickness smaller than the first thickness; and
    an oxidation step of oxidizing the metal layer having undergone the plasma treatment to form a metal oxide which forms a tunnel barrier.

2. The method of manufacturing a magnetoresistive element according to claim 1, wherein the first thickness is 10 Å (inclusive) to 20 Å (inclusive).

3. The method of manufacturing a magnetoresistive element according to claim 1, wherein the second thickness is 6 Å (inclusive) to 14 Å (inclusive).

4. The method of manufacturing a magnetoresistive element according to claim 1, wherein the metal layer contains magnesium.

5. The method of manufacturing a magnetoresistive element according to claim 1, further comprising:
    a metal cap layer forming step of forming a metal cap layer on the tunnel barrier.

6. The method of manufacturing a magnetoresistive element according to claim 1, wherein the metal cap layer has a thickness of 2 Å (inclusive) to 5 Å (inclusive).

7. The method of manufacturing a magnetoresistive element according to claim 1, wherein the inert gas includes at least one gas selected from the group consisting of Ar gas, Kr gas, and Xe gas.

8. The method of manufacturing a magnetoresistive element according to claim 1, wherein in the tunnel barrier forming step, the tunnel barrier is formed on an amorphous ferromagnetic layer, and the tunnel barrier forming step comprises a first annealing step of crystallizing the tunnel barrier, and a second annealing step of crystallizing the ferromagnetic layer at a temperature higher than a temperature in the first annealing step.

9. An apparatus for manufacturing a magnetoresistive element, the apparatus comprising:

a thin film deposition chamber comprising a thin film deposition apparatus configured to deposit a thin film;

an etching chamber comprising gas introduction means for introducing an inert gas, and a dry etching apparatus having an electrode for plasma generation;

an oxidation chamber comprising an oxidation process apparatus configured to perform an oxidation process;

a substrate transport apparatus configured to transport a substrate among said chambers; and a control apparatus configured to control said thin film deposition apparatus, said dry etching apparatus, said oxidation process apparatus, and said substrate transport apparatus, wherein said control apparatus performs an operation of forming a metal layer in said thin film deposition chamber, an operation of performing a plasma treatment which exposes the metal layer to a plasma of an inert gas in said etching chamber to etch the metal layer to have a second thickness smaller than the first thickness, and an operation of oxidizing the metal layer, having undergone the plasma treatment, in said oxidation chamber.

* * * * *